United States Patent
Yao

(10) Patent No.: US 11,740,293 B2
(45) Date of Patent: Aug. 29, 2023

(54) BATTERY CELL MONITOR

(71) Applicant: TEXAS INSTRUMENTS INCORPORATED, Dallas, TX (US)

(72) Inventor: Chidong Yao, Shanghai (CN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 124 days.

(21) Appl. No.: 17/214,270

(22) Filed: Mar. 26, 2021

(65) Prior Publication Data
US 2022/0146581 A1 May 12, 2022

Related U.S. Application Data

(63) Continuation of application No. PCT/CN2020/127094, filed on Nov. 6, 2020.

(30) Foreign Application Priority Data
Nov. 6, 2020 (WO) ................ PCT/CN2020/127094

(51) Int. Cl.
G01R 31/382 (2019.01)
G01R 31/371 (2019.01)
H02J 7/00 (2006.01)

(52) U.S. Cl.
CPC ......... G01R 31/382 (2019.01); G01R 31/371 (2019.01); H02J 7/0047 (2013.01)

(58) Field of Classification Search
None
See application file for complete search history.

(56) References Cited

U.S. PATENT DOCUMENTS 9,236,735 B2 * 1/2016 Yoo ..................... H02J 1/10
2010/0286938 A1 11/2010 Kaneko
2013/0113428 A1 5/2013 Emori et al.
2019/0181661 A1 6/2019 Shen

FOREIGN PATENT DOCUMENTS

CN 102325670 A 1/2012

OTHER PUBLICATIONS

M. Cherukuri and M. Kanthi, "Battery Management System Design for Electric Vehicle," 2019 IEEE International Conference on Distributed Computing, VLSI, Electrical Circuits and Robotics (DISCOVER), 2019, pp. 1-6 (Year: 2019).*
Texas Instruments BQ79606A-Q1 Safe TI TM Precision Monitor With Integrated Hardware Protector for Automotive Battery Pack Application https:www.ti.com/products/BQ769606A-Q1, Dec. 31, 2019, pp. 61, 153.

* cited by examiner

Primary Examiner — Roy Y Yi
(74) Attorney, Agent, or Firm — Ray A. King; Frank D. Cimino

(57) ABSTRACT

A battery cell monitor circuit includes a first serial transceiver, a second serial transceiver, and a command decoder. The command decoder is configured to cause the first serial transceiver or the second serial transceiver to transmit a response to a battery monitoring command based on a response direction field included in the battery monitoring command.

17 Claims, 5 Drawing Sheets

BATTERY CELL MONITOR

CROSS-REFERENCE TO RELATED APPLICATIONS

This application is a continuation of PCT/CN2020/127094, filed Nov. 6, 2020, which is incorporated by reference herein in its entirety.

BACKGROUND

Electrified vehicles, such as electric and hybrid vehicles, include a battery pack and an electric motor to propel the vehicle. The battery pack includes multiple individual battery cells (e.g., lithium ion battery cells) connected to one another to provide power to the vehicle. Battery management circuitry in an electrified vehicle measures voltage of the battery pack as well as individual cell voltages. Battery pack voltage measurements are used in many aspects of vehicle and battery control, e.g., battery online power capability estimation, cell balancing, battery overcharge and over-discharge protection, battery end of life determination, battery charging, etc.

SUMMARY

A battery cell monitor system that equilibrates power consumed by the battery cell monitor circuits is disclosed herein. In one example, a battery cell monitor circuit includes a first serial transceiver, a second serial transceiver, and a command decoder. The command decoder is configured to cause the first serial transceiver or the second serial transceiver to transmit a response to a battery monitoring command based on a response direction field included in the battery monitoring command.

In another example, a method for battery monitoring includes setting a response direction field of a first battery monitoring command to a first value. The first battery monitoring command is transmitted to the battery cell monitor circuit. The method also includes setting the response direction field of a second battery monitoring command to a second value that is different from the first value. The second battery monitoring command is transmitted to the battery cell monitor circuit.

In a further example, an automotive battery system includes a battery cell monitor circuit and a processor. The battery cell monitor circuit includes a first serial transceiver and a second serial transceiver. The processor is communicatively coupled to the battery cell monitor circuit, and is configured to set a response direction field of a battery monitoring command, and transmit the battery monitoring command to the battery cell monitor circuit. The battery cell monitor circuit is configured to select the first serial transceiver or the second serial transceiver for transmitting a response to the battery monitoring command to the processor based on a value of the response direction field.

BRIEF DESCRIPTION OF THE DRAWINGS

For a detailed description of various examples, reference will now be made to the accompanying drawings in which.

DETAILED DESCRIPTION

Figure 1:
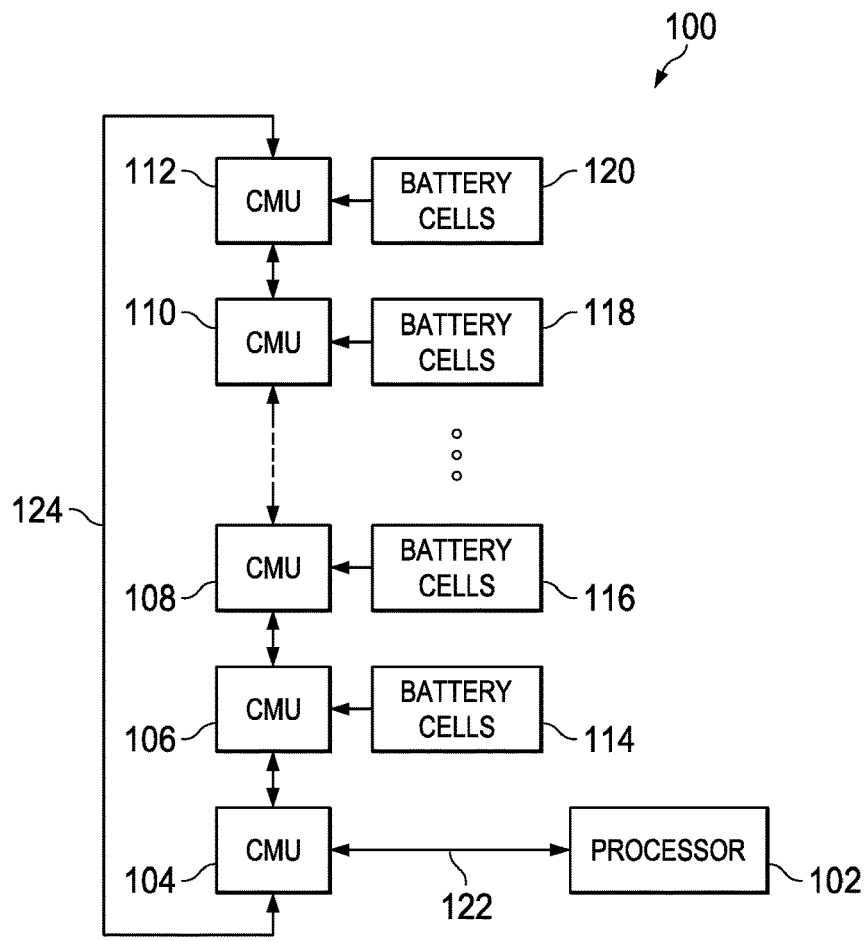
FIG. 1 shows a block diagram for a battery system.

FIG. 1 shows a block diagram for an example battery system 100. The battery system 100 may be an automotive battery system used in an electric or hybrid vehicle. The battery system 100 can also be used in any system that requires a battery, such as personal electronics, industrial systems, or battery-powered tools. The battery system 100 includes a processor 102, battery cell monitor circuits 104, 106, 108, 110, and 112 (also referred to as cell monitoring units (CMU)), and battery cells 114, 116, 118, and 120. While a limited number of battery cell monitor circuits are illustrated in FIG. 1, the battery system 100 may include any number of battery cell monitor circuits, and a battery cell monitor circuit may monitor one or more battery cells. The battery cells 114, 116, 118, and 120 may include one or more battery cells that are monitored by one of the battery cell monitor circuits 104, 106, 108, 110, or 112. The processor 102 is coupled to and communicates with the battery cell monitor circuits 104, 106, 108, 110, and 112 to retrieve measurements of the voltages of the battery cells 114, 116, 118, and 120. The processor 102 can be a microcontroller, a microcomputer or an application-specific-integrated-circuit (ASIC) in some implementations of the battery system 100. Processor 102 may include volatile and/or non-volatile memory.

To retrieve battery cell voltage measurements, the processor 102 transmits, to the battery cell monitor circuits 104, 106, 108, 110, and 112, a command requesting that battery cell voltage measurements be transmitted to the processor 102. Responsive to the command, the battery cell monitor circuits 104, 106, 108, 110, and 112 transmit stored battery cell voltage measurements to the processor 102. The processor 102 communicates with battery cell monitor circuits 104, 106, 108, 110, and 112 via a serial bus 122 or other bus suitable for providing communication between the processor 102 and the battery cell monitor circuit 104. The serial bus 122 implements universal asynchronous receiver transmitter (UART) data transfers or other serial data transfer protocols (e.g., serial peripheral interface (SPI), I²C, or other protocols) in some implementations of the battery system 100.

In the battery system 100, the processor 102 is coupled to the battery cell monitor circuits 106, 108, 110, and 112 via the battery cell monitor circuit 104. The battery cell monitor circuit 104 may be similar to or identical to the battery cell monitor circuits 106-112. In the battery system 100, the battery cell monitor circuit 104 serves as an interface (bridge) between the processor 102 and the battery cell monitor circuits 106-112, and does not monitor battery cells. The processor 102 and the battery cell monitor circuit 104 may operate in a low voltage power domain, where the battery cell monitor circuit 104 is powered by a low voltage (e.g., 5 volt) power supply. The battery cell monitor circuits that measure battery cell voltages (e.g. the battery cell monitor circuits 106-112) may be powered by the battery cells being measured. For example, the battery cell monitor circuit 106 may be powered by the battery cells 112 and the battery cell monitor circuit 108 may be powered by the battery cells 116. If the power consumption of the battery cell monitor circuits 106-112 differ from one another substantially over time (e.g., the battery cell monitor circuit 106 consumes more power than the battery cell monitor circuit 112), then the longevity of the battery stack that includes the battery cells 114-120 may be reduced.

The battery cell monitor circuits 104, 106, 108, 110, and 112 are, preferably, connected in a daisy chain. Each of the battery cell monitor circuits 104, 106, 108, 110, and 112 includes two serial transceivers. In each of the battery cell monitor circuits, one of the serial transceivers provides bidirectional communication with an upstream battery cell monitor circuit and the other serial transceiver provides bidirectional communication with a downstream battery cell monitor circuit. "Upstream" and "downstream" may be defined with respect to command propagation. For example, a command issued by the processor 102 flows downstream through the battery cell monitor circuit 104 to the battery cell monitor circuit 106, and on to the battery cell monitor circuit 108, the battery cell monitor circuit 110, and finally to the battery cell monitor circuit 112. Response to the command flows upstream from the battery cell monitor circuit 112, through the battery cell monitor circuit 110 to the battery cell monitor circuit 108, and on the processor 102 via the battery cell monitor circuit 104.

With such an upstream response flow, each of the battery cell monitor circuits 106, 108, 110, and 112 consumes a different amount of current due to the different amount of data flowing therethrough. The battery cell monitor circuit 112 consumes the least current because it repeats no data received from downstream, while the battery cell monitor circuit 106 consumes the most current because it repeats the data from all of the downstream battery cell monitor circuits (battery cell monitor circuit 108, 110, and 112). The BQ79606A manufactured by TEXAS INSTRUMENTS INCORPORATED is an example of a battery cell monitor circuit.

Embodiments of the battery system 100 disclosed herein equilibrate the current consumed by the daisy chained battery cell monitor circuits 106, 108, 110, and 112 by reversing the direction of response flow for alternate commands. For example, a first command produces an upstream response flow (from the battery cell monitor circuit 112 to the battery cell monitor circuit 106), and a successive command produces a downstream response flow (from the battery cell monitor circuit 106 to the battery cell monitor circuit 112). The direction of response flow may be specified in a field of the commands transmitted by the processor 102. The alternating response flow equalizes the amount of response data flowing through each of the battery cell monitor circuits 106, 108, 110, and 112 over time, which in turn, equalizes the current consumed by the battery cell monitor circuits 106, 108, 110, and 112. Equalization of the current consumed by the battery cell monitor circuits 106-112 helps to optimize the longevity of the battery stack formed by the battery cells 114-120.

Figure 2:
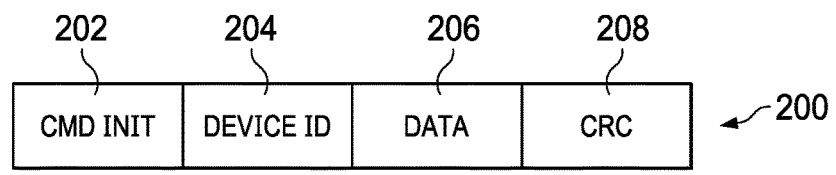
FIG. 2 shows an example battery monitoring command generated in a battery system.
Figure 3:
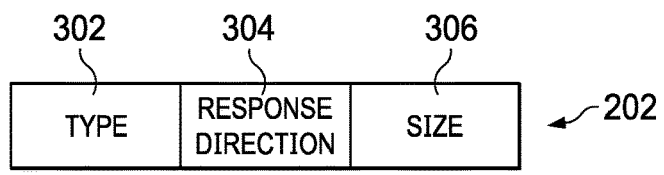
FIG. 3 shows an example initialization field of a battery monitoring command that includes a response direction field.

FIG. 2 shows an example battery monitoring command 200 generated by the processor 102. More specifically, the battery monitoring command 200 requests return of battery cell voltage measurements from the battery cell monitor circuits 106, 108, 110, and 112. The battery monitoring command 200 includes an initialization field 202, a device identification field 204, a data field 206, and a cyclic redundancy check (CRC) field 208. The initialization field 202 includes subfields that specify command type, command size, and response direction. FIG. 3 shows an example of the initialization field 202, including command type field 302, response direction field 304, and command size field 306. The processor 102 constructs the battery monitoring command 200, and selects the value of the response direction field 304 to alternate the direction of response to instances of the battery monitoring command 200 so that the battery cell monitor circuits 106, 108, 110, and 112 consume equal amounts of current over time.

The device identification field 204 identifies a device (e.g., one of the battery cell monitor circuit 106, 108, 110, or 112) to which the battery monitoring command 200 is directed. See FIG. 7 and associated description of explanation of assigning addresses to the battery cell monitor circuit 106, 108, 110, or 112 for device identification. The device identification field 204 is not used if the battery monitoring command 200 is directed to multiple of the battery cell monitor circuits 106, 108, 110, and 112. The data field 206 specifies the amount of data (e.g., number of bytes) to be returned by each battery cell monitor circuit responding to the battery monitoring command 200. The CRC field 206 contains a check value for verifying the contents of the battery monitoring command 200.

Figure 4:
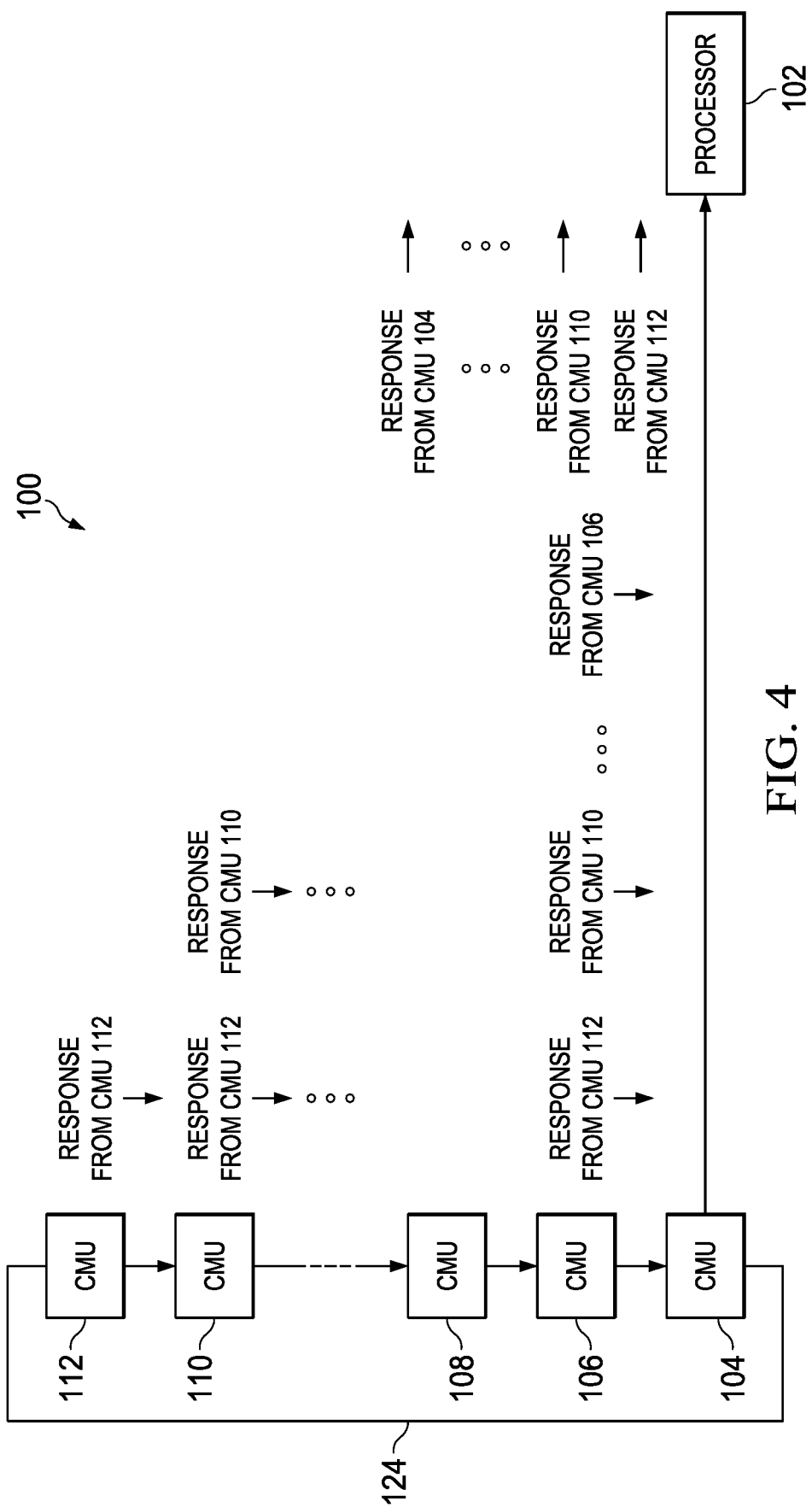
FIG. 4 shows an example of retrieval of battery voltage measurements with upstream response flow.

FIG. 4 shows an example of retrieval of battery voltage measurements with upstream response flow. The processor 102 generates an instance of the battery monitoring command 200 (FIG. 2) with the response direction field 304 (FIG. 3) set to a value that initiates upstream response flow from the battery cell monitor circuits 104, 106, 108, 110, and 112. The battery monitoring command 200 flows downstream through the battery cell monitor circuit 104, the battery cell monitor circuit 106, the battery cell monitor circuit 108, and the battery cell monitor circuit 110 to the battery cell monitor circuit 112. The battery cell monitor circuit 112 transmits a response to the battery cell monitor circuit 110. The battery cell monitor circuit 110 retransmits the response of the battery cell monitor circuit 112 and then transmits its own response to the battery cell monitor circuit 108. In turn, each of the battery cell monitor circuit 108 and the battery cell monitor circuit 106 receive and retransmits responses from the downstream battery cell monitor circuit and transmits its own response. Finally, the battery cell monitor circuit 104 receives and retransmits, in sequence, the responses transmitted by the battery cell monitor circuit 112, the battery cell monitor circuit 110, the battery cell monitor circuit 108, and the battery cell monitor circuit 106, and transmits its own response to the processor 102. With upstream response flow, battery cell monitor circuits 104, 106, 108, 110, and 112 consume less current with increasing downstream distance from the processor 102. Thus, of the battery cell monitor circuits 106, 108, 110, and 112, with upstream response flow the battery cell monitor circuit 106 consumes the most current, and the battery cell monitor circuit 112 consumes the least current. No response data flows in the ring connection 124.

Figure 5:
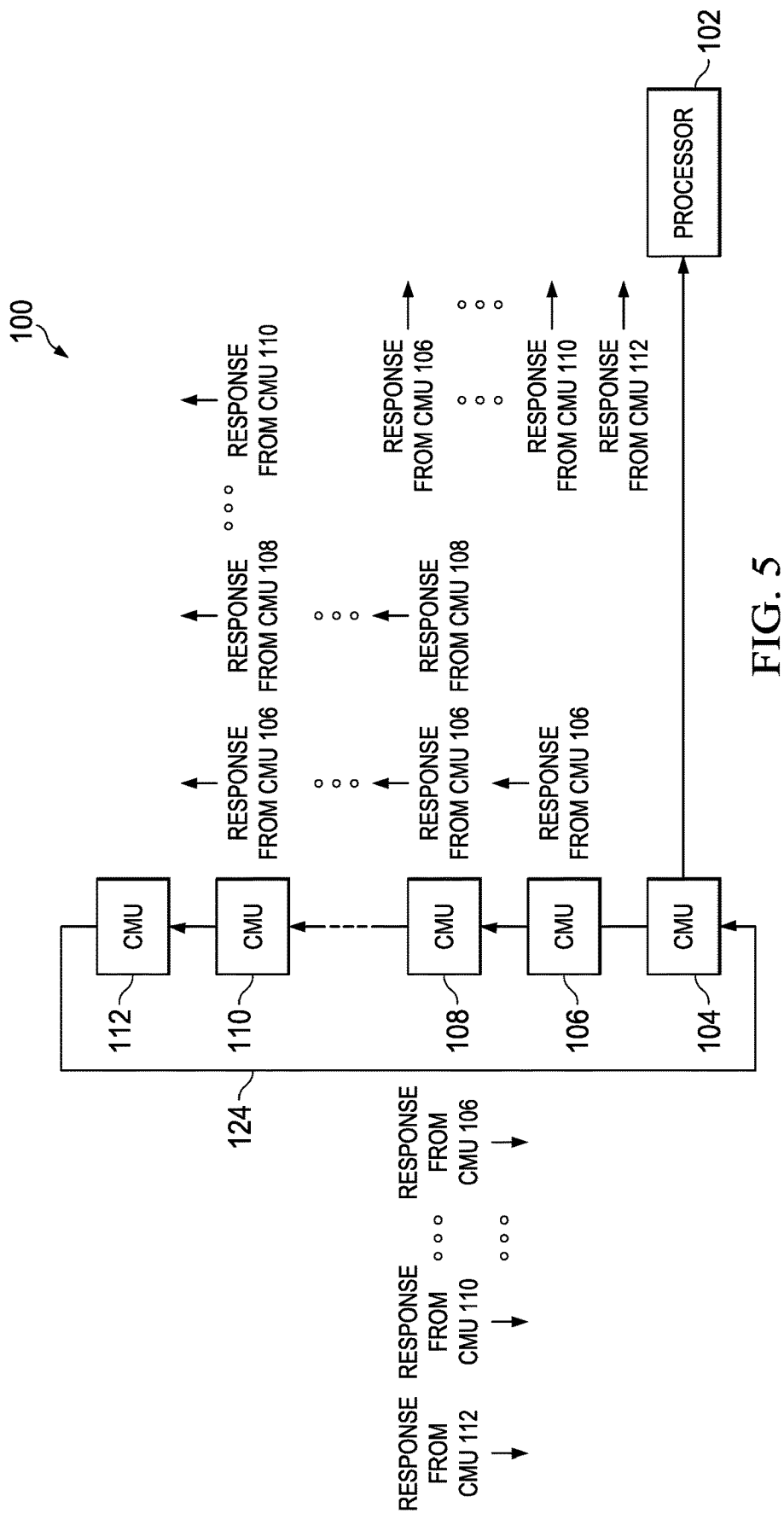
FIG. 5 shows an example of retrieval of battery voltage measurements with downstream response flow.

FIG. 5 shows an example of retrieval of battery voltage measurements with downstream response flow. The processor 102 generates an instance of the battery monitoring command 200 with the response direction field 304 set to a value that initiates downstream response flow from the battery cell monitor circuits 104, 106, 108, 110, and 112. The battery monitoring command 200 flows downstream through the battery cell monitor circuit 104, the battery cell monitor circuit 106, the battery cell monitor circuit 108, and the battery cell monitor circuit 110 to the battery cell monitor circuit 112. The battery cell monitor circuit 106 transmits a response to the battery cell monitor circuit 108. The battery cell monitor circuit 108 retransmits the response of the battery cell monitor circuit 106 and then transmits its own response to the battery cell monitor circuit 110. The battery cell monitor circuit 110 receives and retransmits the responses of the battery cell monitor circuit 106 and the battery cell monitor circuit 108, and then transmits its own response to the battery cell monitor circuit 112. Finally, the battery cell monitor circuit 112 receives and retransmits, in sequence, the responses transmitted by the battery cell monitor circuit 106, the battery cell monitor circuit 108, and the battery cell monitor circuit 110, and transmits its own response via the ring connection 124. The battery cell monitor circuit 104 transmits the responses received via the ring connection 124 to the processor 102. With downstream response flow, battery cell monitor circuits 106, 108, 110, and 112 consume more current with increasing downstream distance from the processor 102. Thus, of the battery cell monitor circuits 106, 108, 110, and 112, with downstream response flow the battery cell monitor circuit 1112 consumes the most current, and the battery cell monitor circuit 106 consumes the least current.

Figure 6:
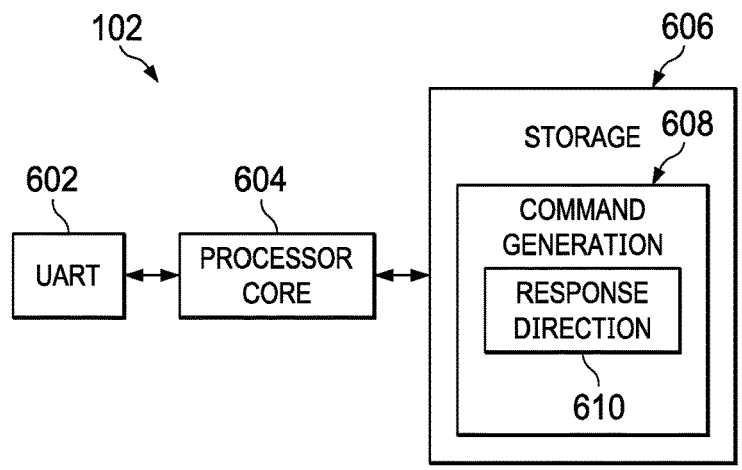
FIG. 6 shows a block diagram for an example processor of the battery system of FIG. 1.

FIG. 6 shows a block diagram for an example of the processor 102. The processor 102 includes a UART 602, a processor core 604, and storage 606. The processor 102 may be implemented as a microcontroller. The UART 602 is coupled to the processor core 604, and provides a serial communication interface for communication between the processor 102 and the battery cell monitor circuits 104, 106, 108, 110, and 112. Some implementations of the processor 102 may include a synchronous serial interface (e.g., an SPI interface) for communication with the battery cell monitor circuits 104, 106, 108, 110, and 112.

The processor core 604 executes instructions retrieved from the storage 606 to perform the functions described herein. The processor core 604 may be an ADVANCED RISC MACHINES (ARM) CORTEX core in some implementations of the processor 102. The storage 606 is a semiconductor memory that may include non-volatile and/or volatile storage, such as FLASH memory and/or static random-access memory. The storage 606 includes instructions that are executed by the processor core 604 to retrieve battery cell voltage measurements from the battery cell monitor circuits 104, 106, 108, 110, and 112. More specifically, the storage 606 includes command generation instructions 608 that are executed by the processor core 604 to construct and transmit the battery monitoring command 200. The command generation instructions 608 includes response direction selection instructions 610 that are executed by the processor core 604 to select the value of the response direction field 304 provided in each instance of the battery monitoring command 200. Implementations of the response direction selection instructions 610 vary the value of the response direction field 304 to equalize the use of the two different response directions over time. Some implementations of the response direction selection instructions 610 may cause the processor core 604 to alternate, over successive instances of the battery monitoring command 200, the value of the response direction field 304 such that the direction of response to the battery monitoring command 200 changes with each battery monitoring command 200. For example, in a first battery monitoring command 200 transmitted the response direction field 304 is encoded to apply an upstream response direction, and in a second battery monitoring command 200 (immediately succeeding the first battery monitoring command 200) the response direction field 304 is encoded to apply a downstream response direction.

Figure 7:
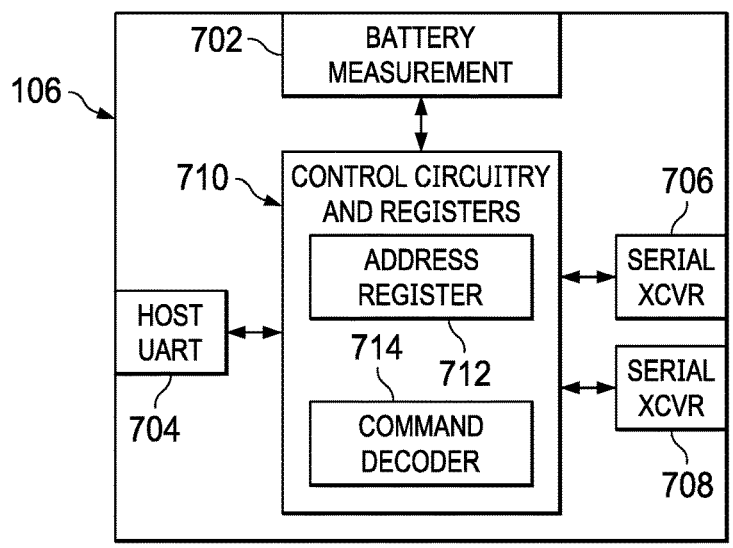
FIG. 7 shows a block diagram for an example battery cell monitor circuit of FIG. 1.

FIG. 7 shows a block diagram for an example of the battery cell monitor circuit 106. The battery cell monitor circuit 104, the battery cell monitor circuit 108, the battery cell monitor circuit 110, and the battery cell monitor circuit 112 may be implemented as instances of the battery cell monitor circuit 106. The battery cell monitor circuit 106 includes battery measurement circuitry 702, a host UART 704, a serial transceiver 706, a serial transceiver 708, and control circuitry and registers 710. The battery measurement circuitry 702 includes circuitry for measuring the voltage of the each of the battery cells 114 coupled to the battery cell monitor circuit 106. For example, the battery measurement circuitry 702 may include analog-to-digital converters to digitize the battery voltages and filter circuitry to limit the bandwidth of battery voltage presented to the analog-to-digital converters.

The host UART 704 provides an interface for serial communication with the processor 102. In the battery system 100, the battery cell monitor circuit 104 is an instance of the system illustrated in FIG. 7, and communicates with the processor 102 (receives commands from the processor 102 and transmits responses to the processor 102) via the host UART 704.

The serial transceiver 706 and the serial transceiver 708 provide serial communication between the battery cell monitor circuit 106 and two other battery cell monitor circuits. For example, the serial transceiver 706 is coupled to the battery cell monitor circuit 104 and provides serial communication between the battery cell monitor circuit 106 and the battery cell monitor circuit 104. The serial transceiver 706 includes a serial receiver circuit for receiving commands and/or responses from the battery cell monitor circuit 104, and a serial transmitter circuit for transmitting responses to the battery cell monitor circuit 104. The serial transceiver 708 is coupled to the battery cell monitor circuit 108 and provides serial communication between the battery cell monitor circuit 106 and the battery cell monitor circuit 108. The serial transceiver 708 includes a serial receiver circuit for receiving responses from the battery cell monitor circuit 108, and a serial transmitter circuit for transmitting commands and responses to the battery cell monitor circuit 108.

The control circuitry and registers 710 is coupled to the battery measurement circuitry 702, the host UART 704, the serial transceiver 706, and the serial transceiver 708. The control circuitry and registers 710 includes an address register 712 and a command decoder 714. The address register 712 stores an address value assigned to the battery cell monitor circuit 106 by the processor 102 at initialization. For example, referring to FIG. 1, the battery cell monitor circuit 104 may be assigned address 1, the battery cell monitor circuit 106 may be assigned address 2, the battery cell monitor circuit 108 may be assigned address 3, the battery cell monitor circuit 110 may be assigned address N−1, and the battery cell monitor circuit 112 may be assigned address N. The command decoder 714 processes commands received via the host UART 704, the serial transceiver 706, or the serial transceiver 708 to identify the received command and parameters. The control circuitry and registers 710 produces a response based on the command and parameters identified by the command decoder 714.

When the battery cell monitor circuit 106 receives the battery monitoring command 200 (e.g., via the serial transceiver 706), the command decoder 714 identifies the command via the command type field 302 and identifies the direction of response via the response direction field 304. If the response direction field 304 specifies an upstream response direction, then the control circuitry and registers 710 selects the serial transceiver 708 to receive response data from downstream (e.g., from the battery cell monitor circuit 108), and selects the serial transceiver 706 to transmit response data upstream (e.g., to the battery cell monitor circuit 104). If the response direction field 304 specifies a downstream response direction, then the control circuitry and registers 710 selects the serial transceiver 706 to receive response data from upstream (e.g., from the battery cell monitor circuit 104), and selects the serial transceiver 708 to transmit response data downstream (e.g., to the battery cell monitor circuit 108).

In the battery cell monitor circuit 106, commands received via the serial transceiver 706 are retransmitted via the serial transceiver 708, response data received via the serial transceiver 706, are retransmitted via the serial transceiver 708, and response data received via the serial transceiver 706 are retransmitted via the serial transceiver 708. The control circuitry and registers 710 determines when to transmit the response data of the battery cell monitor circuit 106 based on the direction of response specified in the response direction field 304. The battery cell monitor circuit 106 transmits its response data when all response data to be received by the battery cell monitor circuit 106 for a given command has been received. Referring to FIG. 4, if the response direction field 304 specifies an upstream response direction, then responses are transmitted starting with the battery cell monitor circuit 112 with successive response transmission by each upstream battery cell monitor circuit.

Figure 8:
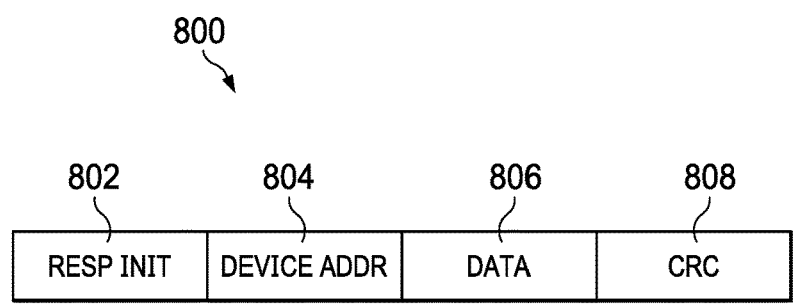
FIG. 8 shows an example response data frame generated by a battery cell monitor circuit.

Each response includes an address of the battery cell monitor circuit that transmitted the response. FIG. 8 shows an example response data frame 800. The response data frame 800 includes a response initialization field 802, a device address field 804, a data field 806, and a CRC field 808. The response initialization field 802 identifies the frame as a response frame. The device address field 804 specifies the address of the battery cell monitor circuit that generated the response data frame 800. The data field 806 contains the payload (e.g., the battery cell voltage measurements). The CRC field 808 is a check value for validating the response data frame 800.

Regarding upstream response transmissions, when a given battery cell monitor circuit receives the response from the battery cell monitor circuit immediately downstream, the given battery cell monitor circuit transmits its response. For example, when the battery cell monitor circuit 106 receives the response transmitted by the battery cell monitor circuit 108, the battery cell monitor circuit 106 retransmits the data received from the battery cell monitor circuit 108 and transmits its own response data. The battery cell monitor circuit 106 identifies the response of the battery cell monitor circuit 108 based on the address included in device address field 804 of the response data of the battery cell monitor circuit 108. For example, if the battery cell monitor circuit 106 is assigned address X, then the battery cell monitor circuit 108 is assigned an address greater than X (e.g., X+1). When the battery cell monitor circuit 106 receives a response including address X+1, the battery cell monitor circuit 106 transmits its own response data.

Referring to FIG. 5, if the response direction field 304 specifies a downstream response direction, then responses are transmitted starting with the battery cell monitor circuit 106 with successive response transmission by each downstream battery cell monitor circuit. When a given battery cell monitor circuit receives the response from the battery cell monitor circuit immediately upstream, the given battery cell monitor circuit transmits its own response. For example, when the battery cell monitor circuit 112 receives the response transmitted by the battery cell monitor circuit 110, the battery cell monitor circuit 112 retransmits the data received from the battery cell monitor circuit 110 and transmits its own response data. The battery cell monitor circuit 112 identifies the response of the battery cell monitor circuit 110 based on the address included in the device address field 804 of the response data of the battery cell monitor circuit 110. For example, if the battery cell monitor circuit 112 is assigned address X, then the battery cell monitor circuit 110 is assigned an address less than X (e.g., X−1). When the battery cell monitor circuit 112 receives a response including address X−1, the battery cell monitor circuit 112 transmits its own response data.

Thus, the control circuitry and registers 710 monitors the addresses of received response data and determines when to transmit based on the direction of response and receipt of response data from a neighboring battery cell monitor circuit.

Figure 9:
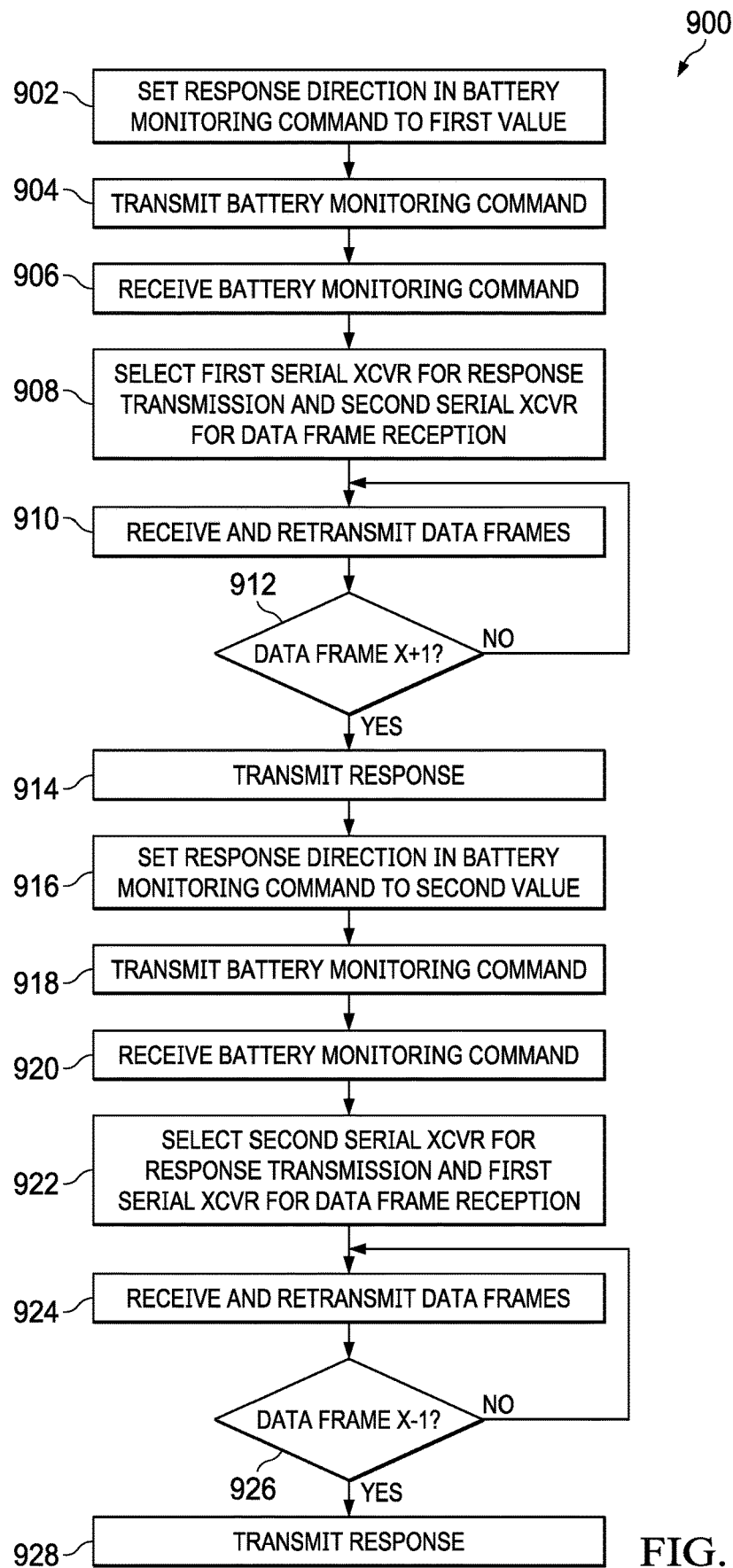
FIG. 9 shows a flow diagram for an example method 900 for battery monitoring.

FIG. 9 shows a flow diagram for an example method 900 for battery monitoring. Though depicted sequentially as a matter of convenience, at least some of the actions shown can be performed in a different order and/or performed in parallel. Additionally, some implementations may perform only some of the actions shown. Operations of the method 900 may be performed by the battery system 100.

In block 902, the processor 102 generates a first instance of the battery monitoring command 200. The processor 102 sets the response direction field 304 to a value that will produce response transmission from the battery cell monitor circuits 104, 106, 108, 110, and 112 in a first direction (e.g., upstream).

In block 904, the processor 102 transmits the battery monitoring command 200 to the battery cell monitor circuit 104. The battery cell monitor circuit 104 retransmits the battery monitoring command 200 to the battery cell monitor circuit 106.

In block 906, the battery cell monitor circuit 106 receives the battery monitoring command 200, and retransmits the battery monitoring command 200 to the battery cell monitor circuit 108.

In block 908, the command decoder 714 extracts the response direction value from the response direction field 304. Based on the response direction value, the control circuitry and registers 710 selects the serial transceiver 706 for response transmission and selects the serial transceiver 708 for receipt of data frames (for receipt of responses from downstream).

In block 910, the battery cell monitor circuit 106 receives a data frame from downstream (from the battery cell monitor circuit 108) and retransmits the data frame upstream (to the battery cell monitor circuit 104).

In block 912, the control circuitry and registers 710 determines whether the received data frame contains an address one higher than the address of the battery cell monitor circuit 106 (e.g., X+1 where the address of the battery cell monitor circuit 106 is X). If the address is not one higher than the address of the battery cell monitor circuit 106, then receipt and retransmission of data frames continues in block 910.

If the address is one higher than the address of the battery cell monitor circuit 106, then the battery cell monitor circuit 106 transmits its own response to the battery monitoring command 200 in block 914.

In block 916, the processor 102 generates a second instance of the battery monitoring command 200. The processor 102 sets the response direction field 304 to a value that will produce response transmission from the battery cell monitor circuits 104, 106, 108, 110, and 112 in a second direction (downstream). The second direction is different from the first direction of block 902.

In block 918, the processor 102 transmits the battery monitoring command 200 to the battery cell monitor circuit 104. The battery cell monitor circuit 104 retransmits the battery monitoring command 200 to the battery cell monitor circuit 106. The battery cell monitor circuit 106 retransmits the battery monitoring command 200 to the battery cell monitor circuit 108 and so on.

In block 920, the battery cell monitor circuit 108 receives the battery monitoring command 200 and retransmits the battery monitoring command 200 to the battery cell monitor circuit 110.

In block 922, the command decoder 714 of the battery cell monitor circuit 108 extracts the response direction value from the response direction field 304. Based on the response direction value, the control circuitry and registers 710 of the battery cell monitor circuit 108 selects the serial transceiver 708 for response transmission and selects the serial transceiver 706 for receipt of data frames (for receipt of response from upstream).

In block 924, battery cell monitor circuit 108 receives a data frame from upstream and retransmits the data frame downstream.

In block 912, the control circuitry and registers 710 of the battery cell monitor circuit 108 determines whether the received data frame contains an address one less than the address of the battery cell monitor circuit 108 (e.g., X–1 where the address of the battery cell monitor circuit 108 is X). If the address is not one less than the address of the battery cell monitor circuit 108, then receipt and retransmission of data frames continues in block 924.

If the address is one less than the address of the battery cell monitor circuit 108, then the battery cell monitor circuit 108 transmits its response to the battery monitoring command 200 in block 928.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A battery cell monitor circuit, comprising:
    an address register;
    a first serial transceiver;
    a second serial transceiver; and
    a command decoder configured to cause at least one of the first serial transceiver or the second serial transceiver to transmit a first battery monitoring command response responsive to a direction field in a battery monitoring command;
    wherein the first serial transceiver is configured to transmit the first battery monitoring command response responsive to the direction field including a first value, and on receipt of a second battery monitoring command response from a device having an address that is higher than an address value stored in the address register.

2. The battery cell monitor circuit of claim 1, wherein the command decoder is configured to select, based the direction field containing the first value, the second serial transceiver for receipt of a data frame generated responsive to the battery monitoring command.

3. The battery cell monitor circuit of claim 1, wherein
    the second serial transceiver is configured to transmit the first battery monitoring command response responsive to the direction field containing a second value, different from the first value, and on receipt of a third battery monitoring command response from a device having an address that is less than an address value stored in the address register.

4. The battery cell monitor circuit of claim 3, wherein the command decoder is configured to select, based on the second value, the first serial transceiver for receipt of a data frame generated responsive to the battery monitoring command.

5. A method for battery monitoring, comprising:
    setting a response direction field of a first battery monitoring command to a first value;
    transmitting the first battery monitoring command to a battery cell monitor circuit, wherein the battery cell monitor circuit includes a first serial transceiver and a second serial transceiver;
    setting the response direction field of a second battery monitoring command to a second value that is different from the first value;
    transmitting the second battery monitoring command to the battery cell monitor circuit receiving the first battery monitoring command in the battery cell monitor circuit;
    selecting, responsive to the first value, the first serial transceiver for transmission of a response to the first battery monitoring command; and
    transmitting the response to the first battery monitoring command via the first serial transceiver.

6. The method of claim 5, further comprising:
    selecting, based on the first value, the second serial transceiver for receipt of a data frame generated responsive to the first battery monitoring command;
    receiving the data frame via the second serial transceiver; and
    transmitting the data frame via the first serial transceiver.

7. The method of claim 6, further comprising transmitting the response to the first battery monitoring command responsive to a first address value contained in the data frame being one greater than a second address value assigned to the battery cell monitor circuit.

8. The method of claim 5, further comprising:
    receiving the second battery monitoring command in the battery cell monitor circuit;
    selecting, responsive to the second value, the second serial transceiver of the battery cell monitor circuit for transmission of a response to the second battery monitoring command; and
    transmitting the response to the second battery monitoring command via the second serial transceiver.

9. The method of claim 8, further comprising:
selecting, based on the second value, the first serial transceiver for receipt of a data frame generated responsive to the second battery monitoring command;
receiving the data frame via the first serial transceiver; and
transmitting the data frame via the second serial transceiver.

10. The method of claim 9, further comprising transmitting the response to the second battery monitoring command based on a first address value contained in the data frame being one less than a second address value assigned to the battery cell monitor circuit.

11. The method of claim 5, further comprising successively transmitting the first battery monitoring command and the second battery monitoring command.

12. An automotive battery system, comprising:
a battery cell monitor circuit having first and second serial transceivers;
a processor communicatively coupled to the battery cell monitor circuit, and configured to:
set a response direction field of a battery monitoring command to a first value; and
transmit the battery monitoring command to the battery cell monitor circuit;
wherein the battery cell monitor circuit is configured to:
select the first serial transceiver or the second serial transceiver for transmitting a response to the battery monitoring command to the processor responsive to a value of the response direction field;
select, responsive to the first value, the first serial transceiver; and
transmit the response to the battery monitoring command to the processor via the first serial transceiver.

13. The automotive battery system of claim 12, wherein:
the battery cell monitor circuit is a first battery cell monitor circuit;
the automotive battery system includes a second battery cell monitor circuit coupled to the first battery cell monitor circuit, the second battery cell monitor circuit configured to transmit a data frame responsive to the battery monitoring command; and
the first battery cell monitor circuit is configured to:
select, based on the first value, the second serial transceiver for receipt of the data frame; and
transmit the data frame to the processor via the first serial transceiver.

14. The automotive battery system of claim 13, wherein:
the battery cell monitor circuit includes an address register; and
the first serial transceiver is configured to transmit the response to the battery monitoring command responsive to the data frame containing an address that is one less than an address value stored in the address register.

15. The automotive battery system of claim 12, wherein:
the processor is configured to set the response direction field to a second value different from the first value; and
the battery cell monitor circuit is configured to:
select, based on the second value, the second serial transceiver; and
transmit the response to the battery monitoring command to the processor via the second serial transceiver.

16. The automotive battery system of claim 15, wherein:
the battery cell monitor circuit is a first battery cell monitor circuit; and
the automotive battery system includes a second battery cell monitor circuit coupled to the first battery cell monitor circuit, the second battery cell monitor circuit configured to transmit a data frame responsive to the battery monitoring command; and
the first battery cell monitor circuit is configured to:
select, based on the second value, the first serial transceiver for receipt of the data frame; and
transmit the data frame to the processor via the second serial transceiver.

17. The automotive battery system of claim 16, wherein:
the battery cell monitor circuit includes an address register; and
the second serial transceiver is configured to transmit the response to the battery monitoring command responsive to the data frame containing an address that is one greater than an address value stored in the address register.

* * * * *